US007337097B2

(12) United States Patent
Ih

(10) Patent No.: US 7,337,097 B2
(45) Date of Patent: Feb. 26, 2008

(54) DYNAMIC MODELING TECHNIQUE FOR THE DEPLOYMENT OF LARGE SATELLITE ANTENNAS

(75) Inventor: Che-Hang C. Ih, Rancho Palos Verdes, CA (US)

(73) Assignee: The Boeing Company, Chicago, IL (US)

( * ) Notice: Subject to any disclaimer, the term of this patent is extended or adjusted under 35 U.S.C. 154(b) by 539 days.

(21) Appl. No.: 10/804,549

(22) Filed: Mar. 18, 2004

(65) Prior Publication Data

US 2005/0209835 A1    Sep. 22, 2005

(51) Int. Cl.
*G06F 7/60* (2006.01)
*G06F 17/00* (2006.01)
*B64G 1/36* (2006.01)

(52) U.S. Cl. .............................. 703/2; 244/171; 701/13
(58) Field of Classification Search ................. 703/2; 244/171; 701/13
See application file for complete search history.

(56) References Cited

U.S. PATENT DOCUMENTS 5,790,071 A * 8/1998 Silverstein et al. .......... 342/354
6,691,033 B1 * 2/2004 Li et al. ....................... 701/222

OTHER PUBLICATIONS

Hollars et al., SD/FAST User's Manual, Version B.2, Sep. 1996, pp. T-47-T-69.*
Michael William Sayers, Simulation Codes Symbolic Computer Methods To Automatically Formulate Vehicle Simulation Codes, Dissertation, University of Michigan, 1990, pp. 1, 204-217.*

* cited by examiner

*Primary Examiner*—Paul Rodriguez
*Assistant Examiner*—Juan Carlos Ochoa
(74) *Attorney, Agent, or Firm*—Jonathan W. Hallman; MacPherson Kwok Chen & Held LLP

(57) ABSTRACT

A method for modeling a structure deployed on a spacecraft. The method includes determining a geometric shape that resembles the structure in a fully deployed configuration; generating time functions for a change in shape of at least one structural component of the structure, the change in shape occurring as the structure expands into the fully deployed configuration; and calculating mass properties of the geometric shape as a function of the time functions.

24 Claims, 5 Drawing Sheets

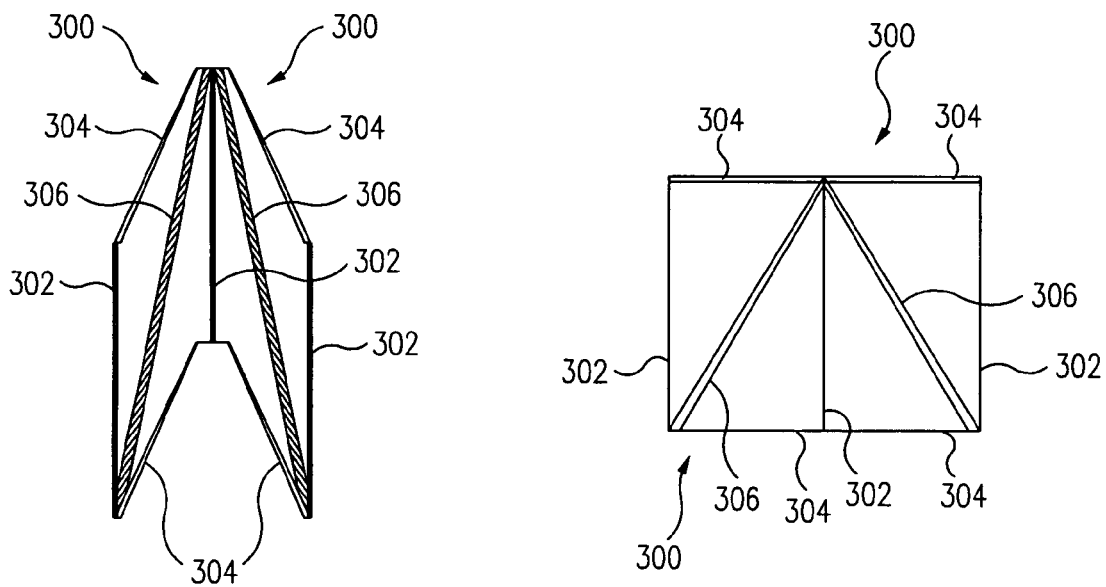
FIG. 3A
FIG. 3B
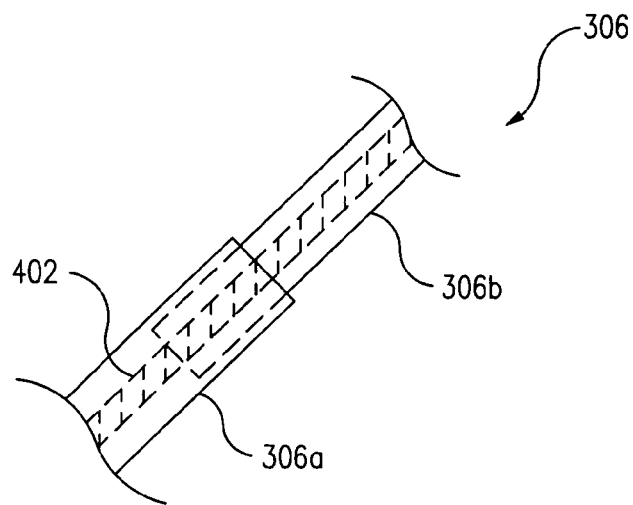
FIG. 4

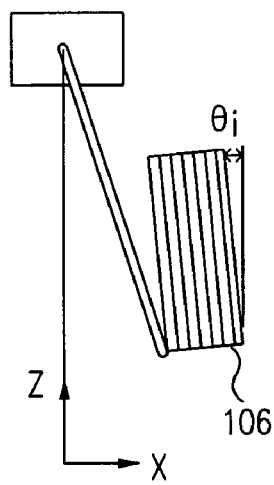
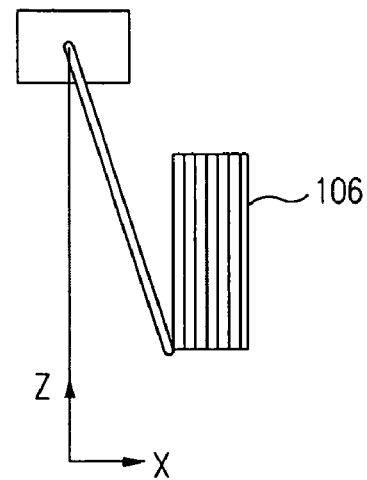
Stowed Configuration
FIG. 7A
Reference Configuration
FIG. 7B
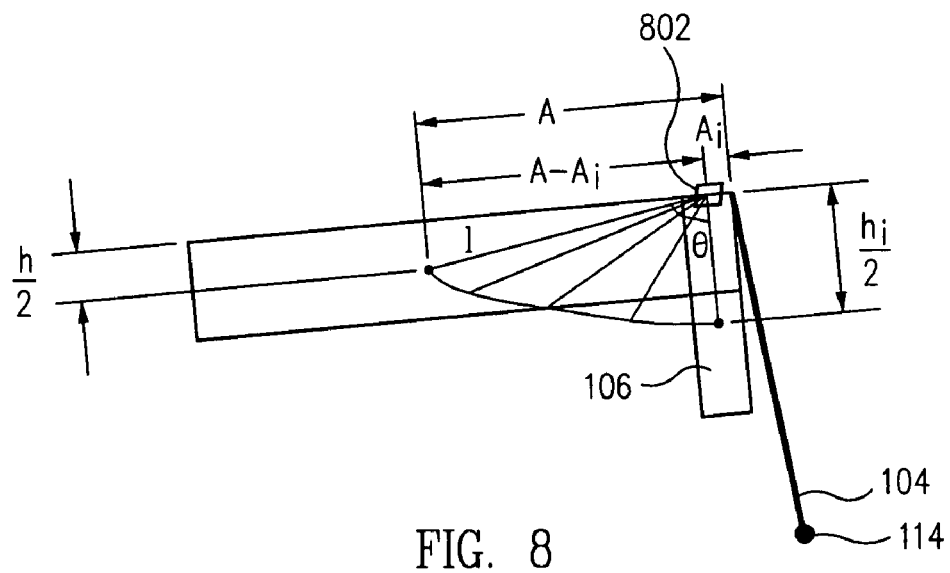
FIG. 8

DYNAMIC MODELING TECHNIQUE FOR THE DEPLOYMENT OF LARGE SATELLITE ANTENNAS

TECHNICAL FIELD

The present invention relates generally to a dynamic modeling system, and more specifically to a dynamic modeling system for modeling the deployment of large structures on a spacecraft as one-body.

BACKGROUND

Most communication systems employing, for example, cellular telephones, require a series of ground station terminals that relay signals to and from satellite systems. The ground station terminals are necessary to boost the signal to the satellite antenna, since most satellite systems have relatively small antennas.

Large satellite antenna structures mounted on spacecraft can reduce or eliminate the signal boost requirement for the ground station terminals, thus reducing or eliminating the need for ground station terminals when using cellular telephones. Accordingly, the deployment of large antenna structures on spacecraft is becoming an increasingly desired occurrence.

Most large structures, including antenna structures, when deployed from a spacecraft have many operational requirements which must be met in order to successfully deploy the structure. For example, it is typically desired to hold the spacecraft at certain orientations during various stages of the deployment. However, the environmental torques and the reaction torques from deploying large structures cause significant attitude perturbation during the deployment process.

Generally, the size, the flexibility, and the time-varying characteristics of the large structure being deployed impose tremendous challenges to the dynamic modeling.

It is well established that proper dynamic modeling is the basis for all successful design programs, especially programs involving deployment of structures on a spacecraft. Only after successful testing on a high-fidelity dynamic model can one have confidence that a design will work in-flight. Thus, "how" to generate a high-fidelity model is an extremely important issue in the control design and analysis of deployment of large structures on the spacecraft.

An antenna structure may be made of numerous truss members, meshes and other components. Because of the relatively large number of components, it is essentially impossible to model an antenna as a multi-body system that includes all of the components due to the tremendous computational burden.

To this point, the traditional approach to model the time-varying mass properties of the large structure deployments on spacecraft has been the concept of "point-mass-on-sliders moving radially outward." However, this approach provides a low accuracy result, and is therefore not an acceptable approach.

As a result, there is a need for an innovative dynamic modeling technique, which can provide a high-fidelity model and also relieve the computational burden significantly.

SUMMARY

Systems and methods are disclosed herein for the dynamic modeling of large structures deployed on spacecraft.

In accordance with the present invention, an approach is developed to model a large structure deployment from a spacecraft as a "one-body" system.

Initially, a geometric shape is selected which most closely resembles the deployed structure. For example, the large structure can be a flexible large reflector, which resembles an elliptically shaped, cylindrical shell. As the large structure is deployed, its mass properties vary over time. The time-varying mass properties are generated as a function of a physical parameter that describes the degree of the deployment.

In accordance with the present invention, given the time period scheduled for the deployment, accurate mass properties can be generated for any time instant. The time-dependent function can be adjusted such that simulated peak loads can be made to replicate actual loads experienced during deployment.

In one aspect of the invention, a method for modeling a structure deployed on a spacecraft is provided which includes selecting a representative geometric shape which resembles a deployed structure; and generating time-varying mass properties of the geometric shape as a function of a physical parameter of the deployed structure that describes the degree of the deployment as one body.

In another aspect of the invention, a method is provided for modeling an expandable structure deployed on a spacecraft. The method includes determining a geometric shape that resembles the expandable structure in a fully expanded configuration; generating time functions for a length of a structural component of the expandable structure, the length configured to vary as the expandable structure expands; and calculating mass properties of the geometric shape as a function of the time functions for the length.

In another aspect of the invention, a method is provided for modeling a structure deployed on a spacecraft. The method includes determining a geometric shape that resembles the structure in a fully deployed configuration; generating time functions for a change in shape of at least one structural component of the structure, the change in shape occurring as the structure expands into the fully deployed configuration; and calculating mass properties of the geometric shape as a function of the time functions.

In yet another aspect of the invention, a method is provided for modeling a structure deployed on a spacecraft. The method includes generating time functions for a structural component located on a periphery of an antenna structure as the structural component varies from a first length to a second length and as the structural component varies between a first orientation and a second orientation; and calculating mass properties of an elliptical cylindrical shell as a function of the time functions.

Beneficially, since the large structure can be modeled as one-body, the large structure deployment model can be easily integrated with other components of the spacecraft, such as the bus, boom, solar wings, and reaction wheels. The relatively few bodies provide for excellent computational efficiency, while emulating a complete spacecraft dynamic model with high fidelity.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 3A is a simplified side view of side-by-side bays of the reflector of FIG. 1 in a "after reflector blooming" configuration in accordance with an embodiment of the present invention;

FIG. 3B is a simplified side view of the bays of FIG. 3A now fully deployed in accordance with an embodiment of the present invention;

FIG. 4 is a simplified cross sectional view of a diagonal member, a component of the bay of FIG. 3A in accordance with an embodiment of the present invention;

FIGS. 7A and 7B are simplified illustrations of the stowed and reference configurations, respectively, of the reflector in accordance with the present invention; and FIG. 8 is a simplified view of the change in center of mass during deployment of the reflector in accordance with the present invention.

Embodiments of the present invention and their advantages are best understood by referring to the detailed description that follows. It should be appreciated that like reference numerals are used to identify like elements illustrated in one or more of the figures.

DETAILED DESCRIPTION

The one-body modeling system of the present invention requires the determination of time-variant mass properties for any geometrically shaped body whether the shape is conventional (e.g. spherical, cylindrical, elliptical, diamond) or non-conventional (e.g. umbrella). Once the time variant mass properties are determined, the deployment of the large structure can be modeled.

Figure 1:
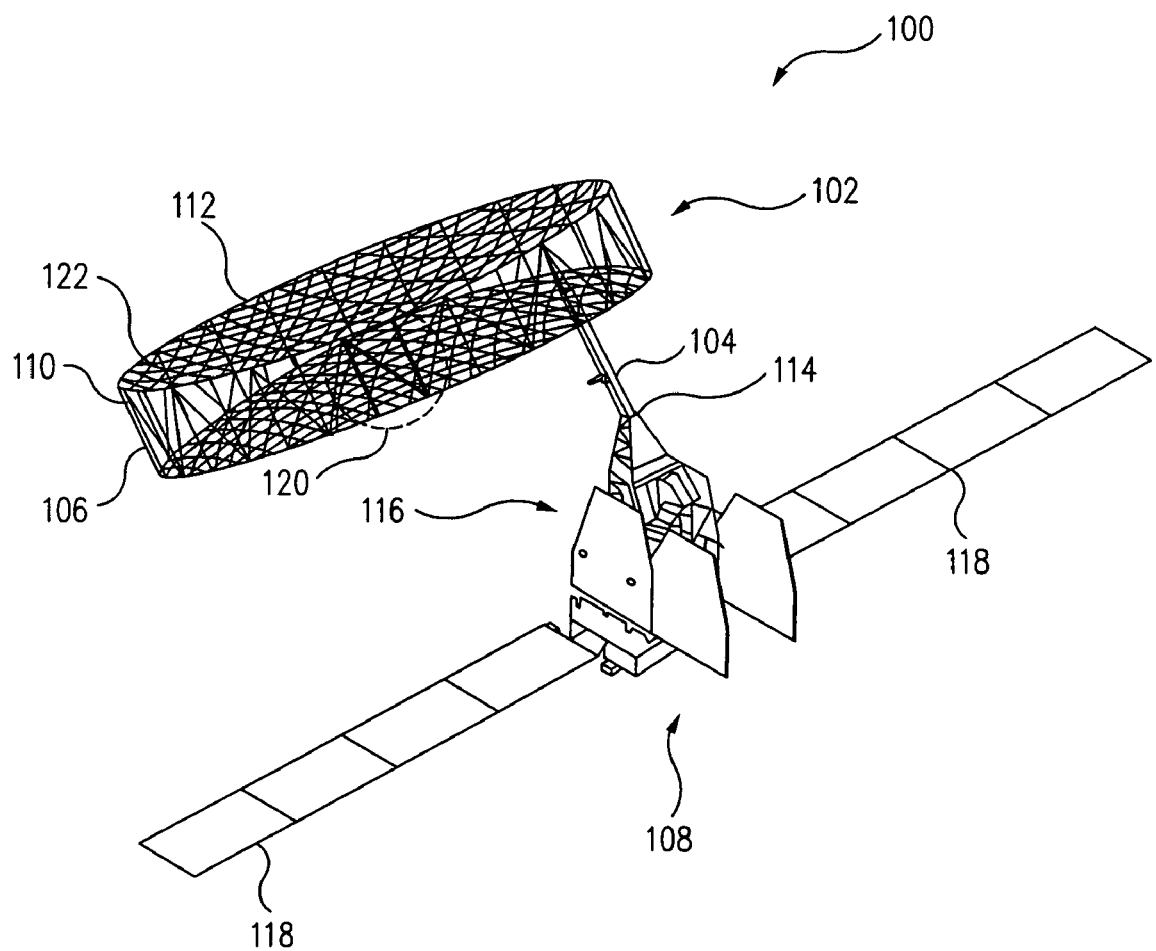
FIG. 1 shows a satellite system having a deployed reflector.

FIG. 1 shows an exemplary embodiment, which provides an example of the one-body modeling concept as applied to a spacecraft 100, having a large deployable antenna structure 102. Antenna structure 102, such as an L-band antenna, includes a reflector 106 which extends out from a satellite 108 on a boom 104. In this exemplary embodiment, reflector 106 includes a myriad of truss members 110 supporting a mesh-like screen 112. In the deployed configuration of FIG. 1, the majority of the mass of reflector 106 is concentrated at the periphery.

Figure 2:
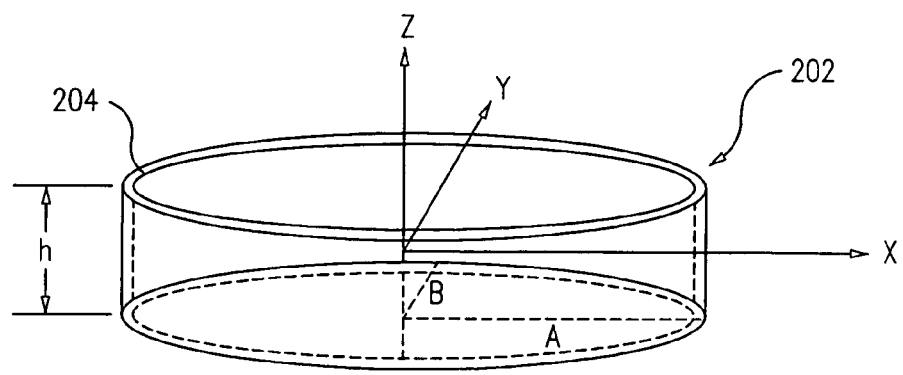
FIG. 2 is a simplified representation of a large structure in a deployed state which resembles an elliptical cylindrical shell in accordance with an exemplary embodiment of the present invention.

The geometric shape which most closely resembles the deployed configuration of the large structure is selected. In the exemplary embodiment, reflector 106 is determined to closely resemble an elliptical cylindrical shell. Accordingly, FIG. 2 shows a simplified version of reflector 106 as a one-body expanding elliptical cylindrical shell 202 having mass evenly distributed on shell wall 204.

Once the approximated geometric shape of the body is determined, measurements are made of the expanding components of the large structure relative to fixed components to determine the time-variant nature of the single body properties.

Although the deployment of large structures from spacecraft can include a multitude of deployable structures, having various shapes and sizes, for ease of understanding, the present invention shall be described and exemplified using the deployment of reflector 106, with no intent to limit the invention.

In the exemplary embodiment, reflector 106 is made of individual bays 120 fastened together on a circumference of reflector 106 to provide support to the reflector mesh 122 (FIG. 1). Each bay 120 is expandable from a stowed or collapsed configuration to a deployed configuration. In the exemplary embodiment, reflector 106 includes 30 bays 120. Measurements are made of the expanding components of bay 120 relative to the fixed components to determine the time-variant nature of the expanding body.

FIG. 3A shows a side view of two adjacent bays 300 of reflector 106. Each bay 300 is separated by each other bay 300 on the circumference of reflector 106 by vertical members called battens 302.

Reflector 106 also includes longerons 304, which are supported by battens 302. Longerons 304 are hinged about each batten 302, such that reflector 106 can be collapsed in a pre-deployment configuration. As shown in FIG. 3B, longerons 304 become perpendicular to battens 302 once reflector 106 becomes fully deployed.

Referring again to FIG. 3A, diagonal members 306 are oriented in each bay 300 extending from the top of one batten 302 to the bottom of an adjacent batten 302 around the circumference of reflector 106.

As shown in FIG. 4, each diagonal member 306 includes two rods 306a and 306b in a telescoping arrangement, with one member sliding into the other. Inside diagonal member 306 is a cable 402 that is continuous through all diagonal members 306 of reflector 106.

To deploy and expand reflector 106 from a collapsed pre-deployment configuration, cable 402 is tightened by, for example, stepping motors (not shown). As shown in FIG. 3A, the tightening of cable 402 causes rods 306b to slide into rod 306a causing diagonal member 306 to "shrink," forcing longerons 304 to pivot about battens 302 of each bay 300 to "extend." All longerons 304 approach the horizontal moving battens 302 into alignment until reflector 106 is fully expanded.

As shown in FIGS. 5A, 5B, 6A, and 6B, in the exemplary embodiment, the deployment of reflector 106 occurs in two stages. It should be understood that other deployable large structures may not require the modeling of two stages, while others may require the modeling of more than two stages of deployment.

In the exemplary embodiment, the first deployment stage is called "reflector blooming." Initially, reflector 106 is in a stowed configuration. The stowed configuration is held using restraining bands. Reflector blooming is initiated by cutting the reflector restraining bands using, for example, pyro band-cutters. In this embodiment, the first deployment stage has a time duration of approximately 8 seconds.

The second deployment stage is called "reflector stepped deployment." The second deployment stage may have a time duration of between about several hours to several days. The modeling of the two stages of deployment in accordance with the present invention will be discussed separately below.

A) First Stage: Reflector Blooming

Figures 5A, 5B:
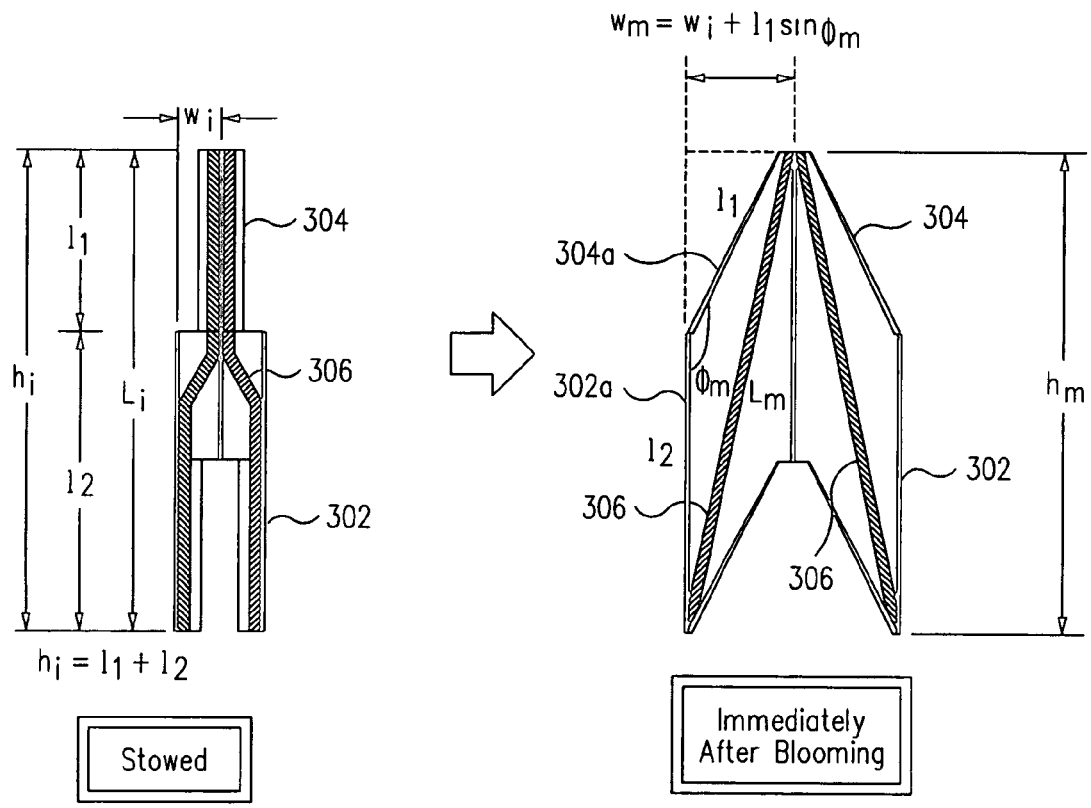
FIGS. 5A and 5B, are simplified side views of bays undergoing a first stage of deployment in accordance with an embodiment of the present invention.

Referring to FIGS. 5A and 5B, a schematic view of the first stage of deployment is provided. As shown in FIGS. 5A and 5B, various physical parameters are known about the large deployable structure prior to and immediately after deployment. For example, in the exemplary embodiment, reflector 106 is initially in a stowed configuration. As reflector 106 expands to its deployed configuration certain parameters change. The definitions of the parameters are listed below:

- $l_1$: length of the longeron
- $l_2$: length of the batten
- $L_i$: length of the diagonal member at stowed configuration
- $L_m$: length of the diagonal member immediately after blooming
- $h_i$: height of the reflector at stowed configuration
- $h_m$: height of the reflector immediately after blooming
- $w_i$: width of each bay at stowed configuration
- $w_m$: width of each bay immediately after blooming The angle $\phi_m$ between longeron 304a (FIG. 5B) and batten 302a (FIG. 5B) varies as reflector 106 is deployed. In this embodiment, the angle measured just after reflector blooming is approximately equal to 158°. It follows then that the length $L_m$ of diagonal member 306 immediately after reflector blooming can be computed as follows.

$$w_m = w_i + l_1 \sin(\pi - \phi_m)$$
$$= w_i + l_1 \sin\phi_m$$
$$h_m = l_2 + l_1 \cos(\pi - \phi_m)$$
$$= l_2 - l_1 \cos\phi_m$$
$$L_m = \sqrt{h_m^2 + w_m^2}$$

With $L_i$, $L_m$, and the time duration (8 seconds) known, numerous time functions for the length L of diagonal member 306 can be generated.

However, how smoothly the length L changes over time determines how much torque is experienced at boom joint 114 (FIG. 1) during reflector blooming.

Ground testing of the deployment structure can be done to determine peak torques and other parameters that may be experienced during deployment in space. It is desirable to make the simulated peak torque match with that of the ground test.

With the following combination of sinusoidal and exponential functions as the time function of L during reflector blooming, and tuning of parameters, the above goal can be achieved.

$$L(t) =$$
$$0.237 * \left\{ \frac{e^{-\zeta \omega t}}{\sqrt{1-\zeta^2}} * \sin\left[\omega\sqrt{1-\zeta^2}\, t + \tan^{-1}\frac{\sqrt{1-\zeta^2}}{\zeta}\right] * (L_i - L_m) + L_m \right\} +$$
$$0.763 * \left\{ L_i + (L_m - L_i) * \left[ t/8 - \frac{1}{2\pi}\sin\frac{2\pi t}{8} \right] \right\}$$

where $\zeta=0.9$ and $\omega=0.9424778$. The damping $\zeta$ and frequency $\omega$ relate to how fast the response exponentially decays. Their values and the coefficients of the above two terms can be tuned to make the torque peak match empirical data, for example, from a ground test. With the time function for L available, the dimensions of semi-major axis A, semi-minor axis B, and h (FIG. 2) can be found. Since:

$$\sin\phi = \frac{2}{l_1 l_2}\sqrt{S(S-L)(S-l_1)(S-l_2)}, \text{ where } S = \frac{1}{2}(L+l_1+l_2)$$
$$w = w_i + l_1 \sin(\pi - \phi)$$
$$= w_i + l_1 \sin\phi$$
$$= w_i + \frac{2}{l_2}\sqrt{S(S-L)(S-l_1)(S-l_2)}$$
$$h = l_2 + l_1\cos(\pi - \phi)$$
$$= l_2 - l_1\cos\phi$$
$$= l_2 + l_1\sqrt{1-\sin^2\phi}$$
$$= l_2 + l_1\sqrt{1 - \frac{4S(S-L)(S-l_1)(S-l_2)}{l_1^2 l_2^2}}$$
$$= l_2 + \frac{1}{l_2}\sqrt{l_1^2 + l_2^2 - 4S(S-L)(S-l_1)(S-l_2)}$$

Once w is found, the perimeter P of the ellipse can be obtained as:

$$P = (w)(30)(1.008)$$

where 1.008 is the conversion factor from "chord" to "arc" that is necessary since the perimeter equation assumes straight lines, while the ellipse is curved. From The Wiley Engineer's Desk Reference, 1984, the relationship between the semi-major axis A, semi-minor axis B, and perimeter P of the ellipse is approximately:

$$P \approx \pi \frac{A+B}{4}\left[3(1+\lambda) + \frac{1}{1-\lambda}\right], \text{ where } \lambda = \left[\frac{A-B}{2(A+B)}\right]^2$$

Assuming the proportion between A and B is constant, (i.e., B=f A), then:

$$\lambda = \left[\frac{A-B}{2(A+B)}\right]^2 = \left[\frac{A-fA}{2(A+fA)}\right]^2 = \left[\frac{1-f}{2(1+f)}\right]^2$$

which is known since f is known. Also, $$P \approx \pi\frac{A+B}{4}\left[3(1+\lambda) + \frac{1}{1-\lambda}\right]$$
$$= \frac{\pi A(1+f)}{4}\left[\frac{3(1-\lambda^2)+1}{1-\lambda}\right]$$
$$= \frac{\pi A(1+f)}{4}\left[\frac{4-3\lambda^2}{1-\lambda}\right]$$
$$\therefore A = \frac{4(1-\lambda)P}{\pi(1+f)(4-3\lambda^2)}$$
$$B = fA$$

Thus, the moments of inertia for first stage deployment can be computed as:

$$I_{xx} = \frac{m}{12}(6B^2 + h^2)$$

-continued $$I_{yy} = \frac{m}{12}(6A^2 + h^2)$$

$$I_{zz} = \frac{m}{12}(A^2 + B^2)$$

B) Second Stage: Reflector Stepped Deployment

Figures 6A, 6B:
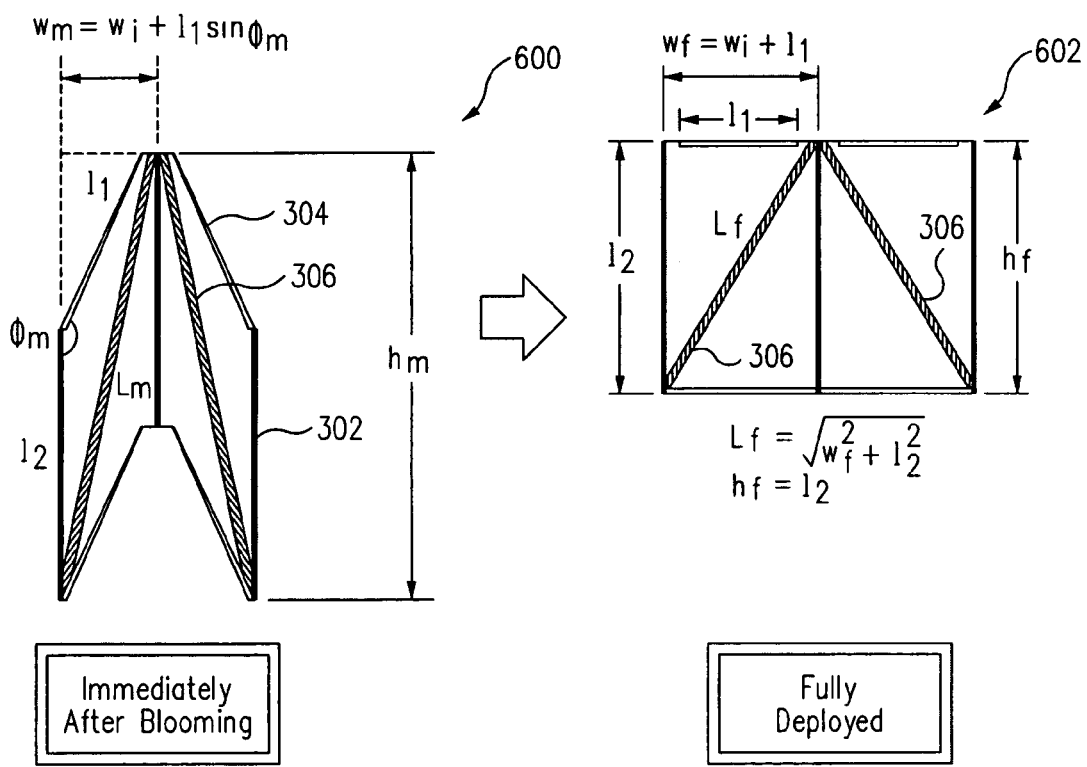
FIGS. 6A and 6B, are simplified side views of bays undergoing a second stage of deployment in accordance with an embodiment of the present invention.

As shown in FIGS. 6A and 6B, in the second deployment stage, reflector 106 gradually grows from the after blooming configuration 600 to the fully deployed configuration 602. The actual elapsed time of the second deployment stage can vary between several hours and several days, however, in this exemplary embodiment, a total 24-hour reflector deployment time is assumed.

The length $L_f$ of diagonal member 306 at fully deployed configuration 602 and the duration of deployment (24 hours in this example) are also known in addition to the initial length $L_m$ of diagonal member 306. In this embodiment, the time function for L in the second stage is chosen to be a $5^{th}$ order polynomial. Since the deployment in the second stage is considered to be smooth, the first and second derivatives of the time function for L can be set equal to zero at the beginning and the end of this stage as follows:

L(0)=$L_m$
L(T)=$L_f$
L'(0)=0
L'(T)=0
L''(0)=0
L''(T)=0 where T=86,392 sec (24 hours minus 8 seconds for reflector blooming). With the above boundary conditions, the coefficients of the polynomial can be solved to obtain the time function for L as:

$$L = L_m + \frac{5(L_f - L_m)}{3223967700774144}t^3 - \frac{15(L_f - L_m)}{55704991546559696896}t^4 + \frac{3(L_f - L_m)}{24062328148845192667119616}t^5$$

where t is expressed in seconds. With L available, $I_{xx}$, $I_{yy}$, and $I_{zz}$ can be obtained in exactly the same way as those in Subsection A.

C) Assembled Model

Referring again to FIG. 1, the exemplary embodiment of spacecraft 100 can include other bodies beside reflector 106 that require deployment modeling. In the exemplary embodiment, other bodies that require modeling include a central bus 116, 2 solar wings 118, 4 reaction wheels (not shown), boom 104, and reflector 106. The bodies are assembled together using any available modeling software tool. The modeling software tool provides physically-based simulation of mechanical systems by taking a short description of an articulated system of rigid bodies (bodies connected by joints) and deriving the full nonlinear equations of motion for that system. An exemplary modeling software tool is SD/FAST, available from PTC® of Needham, Mass.

As shown in FIG. 8, the reflector center of mass motion can be prescribed as a combination of rotation and translation. The rotation is expressed in terms of θ about y-axis. Software modeling tools typically do not model a joint that can provide both rotational and translation motion at the same time. Thus, a fictitious body 802, with negligible mass and inertia, can be added to the configuration, and used to provide either the rotational or translational motion through a joint. In this exemplary embodiment, fictitious body 802 is added to provide rotational motion through a "pin" joint.

The assembly of solar wings 118 and the reaction wheels is typical.

Boom 104 is attached to bus 116 through a pin joint. Fictitious body 802 is attached to boom 104 through a pin joint. Reflector 106 is attached to fictitious body 802 through a "slider" joint. In addition to rotation, the center of mass also translates or "slides out". The sliding joint is used to provide that translation.

Referring again to FIG. 8, the distance of the center of mass is expressed in terms of l. The initial value for l is:

$$l_i = \frac{h_i}{2}$$

where $h_i$ is the initial height of reflector 106. The distance at any time during the deployment is $$l = \sqrt{(A - A_i)^2 + \left(\frac{h}{2}\right)^2}$$

where $A_i$ is the initial semi-major axis of the reflector, and A and h, are the semi-major axis and height at any time, and have been derived before.

A reference configuration of the system is defined. In the reference configuration, the axes of all the coordinate frames are exactly aligned and the generalized coordinates defining the position of each body or frame in the system are made equal to zero. All geometry, mass properties, joint locations, and orientations are also defined in this configuration.

FIG. 7A shows the stowed configuration for reflector 106. In the exemplary embodiment, reflector 106 is angled relative to the negative y-axis approximately 6.6°. However, in order to let the "sliding" occur along the z-axis and have the reflector's inertia expressed with respect to the principal axes, the reference configuration is selected as shown in FIG. 7B Thus, to account for the 6.6° angle, the initial θ, $θ_i$, becomes −6.6° (about y-axis, see FIG. 7A). Thus, angle θ at any time step can be computed as:

$$\theta = -6.6^0 + \tan^{-1}\left(\frac{A - A_i}{\frac{h}{2}}\right) = -6.6^0 + \tan^{-1}\left(\frac{2(A - A_i)}{h}\right)$$

The rotation θ of fictitious body 802 and the translation l of reflector 106 are prescribed using the existing SD-FAST functions. Linear and angular momenta are guaranteed to be conserved if prescribed motion is used.

The dynamic model thus described authentically duplicates the dynamic response of reflector 106 deployment sequence on-orbit.

Embodiments described above illustrate but do not limit the invention. It should also be understood that numerous modifications and variations are possible in accordance with the principles of the present invention. For example, it should be understood by those of ordinary skill in the art that in some embodiments, deploying a large structure on a spacecraft does not necessarily require a two stage deployment, and that the two stage deployment discussed above should be considered as only an exemplary embodiment of the invention, and is therefore not to be considered limiting. Accordingly, the scope of the invention is defined only by the following claims.

What is claimed is:

1. A method for modeling a structure deployed on a spacecraft comprising:
   selecting a representative one-body geometric shape which resembles a deployed structure; and
   generating time-varying mass properties of said geometric shape as a function of a physical parameter of said deployed structure that describes the degree of the deployment as one body.

2. The method of claim 1, wherein said deployed structure comprises a flexible large reflector.

3. The method of claim 2, wherein said flexible large reflector compnses an L-band antenna.

4. The method of claim 1, wherein said geometric shape is taken from the group consisting of spherical, cylindrical and elliptical shapes.

5. The method of claim 1, wherein said generating comprises calculating the rotational and translation variation of a center of mass of said deployed structure as one body.

6. The method of claim 1, wherein said physical parameter of said deployed structure comprises at least one mechanical member having a variable length.

7. The method of claim 1, wherein said physical parameter of said deployed structure comprises at least one mechanical member which has a variable orientation relative to other mechanical members of said deployed structure.

8. A method for modeling a structure deployed on a spacecraft comprising:
   determining a one-body geometric shape that resembles the structure in a fully deployed configuration;
   generating time functions for a change in shape of at least one structural component of said structure, said change in shape occurring as said structure expands into said fully deployed configuration; and
   calculating mass properties of said geometric shape as a function of said time functions.

9. The method of claim 8, wherein said structure comprises an antenna structure.

10. The method of claim 9, wherein said antenna structure comprises an L-band antenna.

11. The method of claim 8, wherein said one-body geometric shape comprises an elliptical cylindrical shell.

12. The method of claim 8, wherein said one-body geometric shape is taken from the group consisting of spherical, cylindrical and elliptical shapes.

13. The method of claim 8, wherein said calculating comprises calculating the rotational and translation variation of a center of mass of said one-body geometric shape.

14. The method of claim 8, wherein said structural component comprises a plurality of truss members configured to support a mesh-like screen, wherein at least one of said truss members comprises a variable length and wherein at least one of said truss members changes orientation relative to said other truss members.

15. A method for modeling a structure deployed on a spacecraft comprising:
   generating time functions for a structural component located on a periphery of an antenna structure as said structural component varies from a first length to a second length and as said structural component varies between a first orientation and a second orientation; and
   calculating mass properties of a one-body elliptical cylindrical shell as a function of said time functions.

16. The method of claim 15, wherein said antenna structure comprises an L-band antenna.

17. The method of claim 15, wherein said calculating comprises calculating the rotational and translation variation of a center of mass of said elliptical cylindrical shell.

18. A method for modeling an expandable structure deployed on a spacecraft comprising:
   determining a one-body geometric shape that resembles the expandable structure in a fully expanded configuration;
   generating time functions for a length of a structural component of said expandable structure, said length configured to vary as said expandable structure expands; and
   calculating mass properties of said one-body geometric shape as a function of said time functions for said length.

19. The method of claim 18, wherein said expandable structure compnses an antenna structure.

20. The method of claim 19, wherein said antenna structure comprises an L-band antenna.

21. The method of claim 18, wherein said one-body geometric shape comprises an elliptical cylindrical shell.

22. The method of claim 18, wherein said geometric shape is taken from the group consisting of spherical, cylindrical and elliptical shapes.

23. The method of claim 18, wherein said calculating comprises calculating the rotational and translation variation of a center of mass of said geometric shape.

24. The method of claim 18, wherein said structural component comprises a plurality of truss members configured to support a mesh-like screen, wherein at least one of said truss members comprises a variable length and wherein at least one of said truss members changes orientation relative to said other truss members.

* * * * *